United States Patent
Uekubo

(10) Patent No.: US 12,352,502 B2
(45) Date of Patent: Jul. 8, 2025

(54) HEAT TRANSPORT DEVICE

(71) Applicant: FURUKAWA ELECTRIC CO., LTD., Tokyo (JP)

(72) Inventor: Masahiro Uekubo, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 259 days.

(21) Appl. No.: 18/003,627

(22) PCT Filed: Jun. 25, 2021

(86) PCT No.: PCT/JP2021/024249
§ 371 (c)(1),
(2) Date: Dec. 28, 2022

(87) PCT Pub. No.: WO2022/004616
PCT Pub. Date: Jan. 6, 2022

(65) Prior Publication Data
US 2023/0266069 A1      Aug. 24, 2023

(30) Foreign Application Priority Data

Jun. 30, 2020   (JP) ................................. 2020-112760

(51) Int. Cl.
*F28D 15/04*          (2006.01)
(52) U.S. Cl.
CPC .................................. *F28D 15/04* (2013.01)
(58) Field of Classification Search
CPC .... F28D 15/0233; F28D 15/025; F28D 15/04; F28F 3/048; H01L 23/427
See application file for complete search history.

(56) References Cited

U.S. PATENT DOCUMENTS

2006/0131002 A1   6/2006  Mochizuki et al.
2012/0137718 A1*  6/2012  Uchida .............. H05K 7/20336
                                                          62/434
(Continued)

FOREIGN PATENT DOCUMENTS

CN     106066130 A  * 11/2016
JP     9-184696 A     7/1997
(Continued)

OTHER PUBLICATIONS

Pdf is translation of foreign reference CN 106066130 A (Year: 2016).*

(Continued)

*Primary Examiner* — Len Tran
*Assistant Examiner* — Kamran Tavakoldavani
(74) *Attorney, Agent, or Firm* — Oblon, McClelland, Maier & Neustadt, L.L.P.

(57) ABSTRACT

A heat transport device in a container having an internal space filled with a working fluid, includes an evaporator which causes the working fluid to evaporate, a condenser separated from the evaporator and which causes the working fluid to condense, and an intermediate part arranged between the evaporator and the condenser and having at least one main groove which extends continuously from the condenser to the evaporator through the intermediate part. A part or entirety of main grooves among the at least one main groove is a sloped groove having a sloped groove bottom that, when viewing a cross section along an extending direction of the main groove, slopes from a groove bottom position of a groove portion positioned at the condenser towards a groove bottom position of the groove portion positioned at the evaporator, so as to approach a bottom surface of the heat transport device.

20 Claims, 7 Drawing Sheets

(56) References Cited

U.S. PATENT DOCUMENTS

2016/0091258 A1* 3/2016 Ahamed ............ F28D 15/0233
                                                  165/104.26
2019/0141855 A1   5/2019 Inagaki et al.

FOREIGN PATENT DOCUMENTS

| JP | H-09184696 A | * | 7/1997 |
| JP | 2003-148887 A | | 5/2003 |
| JP | 2006-170602 A | | 6/2006 |
| JP | 2018-128208 A | | 8/2018 |
| WO | WO 2018/003957 A1 | | 1/2018 |

OTHER PUBLICATIONS

Pdf is translation of foreign reference JPH 09184696 A (Year: 1997).*

International Search Report issued Jul. 27, 2021 in PCT/JP2021/024249, filed on Jun. 25, 2021, 2 pages.

Japanese Notice of Reasons for Refusal issued Oct. 8, 2024 in Japanese Patent Application No. 2020-112760 with English Machine translation, 12 pgs.

* cited by examiner

HEAT TRANSPORT DEVICE

TECHNICAL FIELD

The present invention relates to a heat transport device, and more specifically, relates to a heat transport device which reliably conveys a working fluid which has phase changed to liquid-phase working fluid by condensation to an evaporator in which phase change to a gas-phase working fluid is carried out, and promotes evaporation of the liquid-phase working fluid in the evaporator.

BACKGROUND ART

Accompanying the increased functionality of electronic devices in recent years, there is a trend of heat generating bodies such as electrical/electronic components being mounted in high density (hereinafter may be referred to simply as "heat generating body"), and the heat generation amount of the heat generating bodies increasing. Due to being a cause for the heat generating body causing malfunction, etc. when the temperature of the heat generating body rises to exceed a predetermined permissible temperature, the temperature of the heat generating body always must be continuously maintained at no more than the permissible temperature. For this reason, a heat transport device for transporting the heat possessed by the heat generating body to outside is normally mounted inside of the electronic device. As such a heat transport device, for example, a vapor chamber and heat pipe have been known which include an evaporator causing a liquid-phase working fluid to evaporate and phase change to a gas-phase working fluid; and an evaporator causing the gas-phase working fluid to condense and phase change to the liquid-phase working fluid, and which transport latent heat (heat of vaporization) by phase changing the working fluid.

With a heat generating bodies such as electrical/electronic components constituting an electronic device, since there is a trend of the heat generated amount increasing as mentioned above, it has been demanded to further improve the heat transport performance of the heat transport device. To further improve the heat transport performance of the heat transport device, it is useful to smooth the circulation of working fluid inside of the heat transport device.

As means for smoothing the circulation of working fluid inside of the heat transport device, for example, Patent Document 1 discloses a heat transport device (vapor chamber) in which a sealed space is formed by a first metal sheet and a second metal sheet, the vapor chamber having, in at least part of a sealed space, a flow passage concave part through which a liquid working fluid and steam of the working fluid pass, and a bottom surface groove formed in the bottom surface of this flow passage concave part. With this heat transport device, by providing the bottom surface groove in the bottom surface of the flow passage concave part, it is said to be possible to promote transport of the liquid working fluid to the evaporator, and possible to increase the heat exchange area between the steam of the working fluid and the metal sheet, thereby promoting condensation of the steam of the working fluid.

Patent Document 1: Japanese Unexamined Patent Application, Publication No. 2018-128208

DISCLOSURE OF THE INVENTION

Problems to be Solved by the Invention

However, the heat transport device of Patent Document 1 condenses the steam of the working fluid using the bottom surface groove formed over the entire length at a depth substantially equal by wet etching, and transports the liquid working fluid obtained by condensation to the evaporator.

In this regard, a heat transport device is desired which smooths the phase change from liquid phase to gas phase of the working fluid in order to improve the heat transport performance, and thus is configured so that a smooth circulatory flow path of working fluid is formed in the internal space of the container, by the gas-phase working fluid having become steam by absorbing the heat generated from a heat generating body into the liquid-phase working fluid at the evaporator being efficiently transported from the evaporator to the condenser, and the liquid-phase working fluid having condensed by releasing the heat of the gas-phase working fluid as heat of condensation at the condenser being efficiently transported from the condenser to the evaporator.

An object of the present invention is to provide a heat transport device enabling raising the heat transport performance by improving the transfer efficiency of latent heat upon causing the working fluid to phase change from liquid phase to gas phase.

Means for Solving the Problems

In order to achieve the above object, the essential configuration of the present invention is as follows. A heat transport device according to a first aspect of the present invention in a container having an internal space in which a working fluid is filled, includes: an evaporator which causes the working fluid to evaporate; a condenser which is arranged at a position separated from the evaporator and causes the working fluid to condense; and an intermediate part arranged between the evaporator and the condenser, in which at least one main groove which extends continuously from the condenser to the evaporator through the intermediate part is formed in the container, and a part or entirety of main grooves among the at least one main groove is a sloped groove having a sloped groove bottom that, when viewing a cross section along an extending direction of the main groove, slopes from a groove bottom position of a groove portion positioned at the condenser towards a groove bottom position of the groove portion positioned at the evaporator, so as to approach a bottom surface of the heat transport device. According to a second aspect of the present invention, in the heat transport device as described in the first aspect, the sloped groove is formed so that a plate thickness of the container positioned directly below the sloped groove bottom becomes thinner from the groove portion positioned at the condenser toward the groove portion positioned at the evaporator. According to a third aspect of the present invention, in the heat transport device as described in the first or second aspect, the sloped groove bottom is formed at a groove portion of the sloped groove extending at least from the condenser to the intermediate part. According to a fourth aspect of the present invention, in the heat transport device as described in any one of the first to third aspects, the sloped groove bottom is formed over an entire length of the sloped groove. According to a fifth aspect of the present invention, in the heat transport device as described in any one of the first to fourth aspects, a portion linking a center position of the condenser and a center position of the evaporator when viewing a cross section along the extending direction of the sloped groove, has an average sloping angle relative to a heat input surface of the container in a range of at least 1 degree and no more than 30 degrees. According to a sixth aspect of the present invention, in the heat transport device as described in any one of the first to fifth aspects, an opening groove width of the sloped groove is in a range of at least 1 μm and no more than 1,000 μm. According to a seventh aspect of the present invention, in the heat transport device as described in any one of the first to sixth aspects, the at least one main groove formed in the container is two or more of the sloped grooves, the sloped grooves are arranged in parallel with an interval from each other, and the internal space is formed by a groove internal space parts divided by the sloped groove, and a groove external space part formed above an opening end of the sloped groove. According to an eighth aspect of the present invention, in the heat transport device as described in the seventh aspect, the container further includes at least one auxiliary groove extending in a direction crossing the main groove, at the evaporator. According to a ninth aspect of the present invention, in the heat transport device as described in any one of the first to eighth aspects, the container further includes a porous material at an inner surface portion of the evaporator facing the internal space, and the porous material is configured by a sintered compact which is sintered to include metal or alloy of powder, fiber, flake, porous or fragment form. According to a tenth aspect of the present invention, in the heat transport device as described in any one of the first to ninth aspects, the container comprises copper, copper alloy, aluminum, aluminum alloy, nickel, nickel alloy, steel alloy, titanium or titanium alloy. According to an eleventh aspect of the present invention, in the heat transport device as described in any one of the first to tenth aspects, the container is formed from a plurality of metal sheets, and is used as a vapor chamber. According to a twelfth aspect of the present invention, in the heat transport device as described in any one of the first to tenth aspects, the container is used as a heat pipe formed by a tubular container having a rectangular cross-sectional shape.

Effects of the Invention

According to the present invention, it is possible to provide a heat transport device having enhanced heat transport performance.

BRIEF DESCRIPTION OF THE DRAWINGS

FIG. 1A is a plan perspective view, FIG. 1B is a cross-sectional view when cutting along the line $I_A$-$I_A$ in FIG. 1A, FIG. 1C is a cross-sectional view when cutting along the line $I_B$-$I_B$ in FIG. 1A, and FIG. 1D is a cross-sectional view when cutting along the line $I_C$-$I_C$ in FIG. 1A.

FIG. 2A is a plan perspective view, and FIG. 2B is a cross-sectional view when cutting along the line $II_A$-$II_A$ in FIG. 2A.

FIG. 3A is a plan perspective view, and FIG. 3B is a cross-sectional view when cutting along the line $III_A$-$III_A$ in FIG. 3A.

FIG. 4A is a plan perspective view, and FIG. 4B is a cross-sectional view when cutting along the line $IV_A$-$IV_A$ in FIG. 4A.

FIG. 5A is a plan perspective view, FIG. 5B is a cross-sectional view when cutting along the line $V_A$-$V_A$, in FIG. 5A, and FIG. 5C is a cross-sectional view when cutting along the line $V_D$-$V_D$ in FIG. 5A.

FIG. 6A is a plan perspective view, and FIG. 6B is a cross-sectional view when cutting along the line $VI_A$-$VI_A$ in FIG. 6A.

FIG. 7A is a plan perspective view, FIG. 7B is a cross-sectional view when cutting along the line $VII_A$-$VII_A$ in FIG. 7A, and FIG. 7C is a cross-sectional view when cutting along the line $VII_B$-$VII_B$ in FIG. 7A.

PREFERRED MODE FOR CARRYING OUT THE INVENTION

Next, heat transport devices according to some embodiments of the present invention will be explained below.

First Embodiment

Figure 1A:
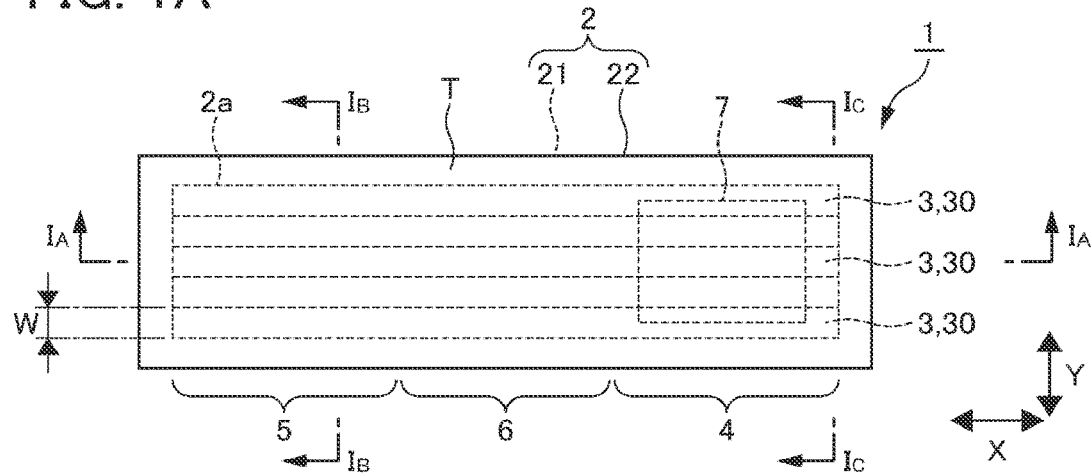
FIGS. 1A to 1D are views showing the internal structure of a vapor chamber which is a heat transport device of a first embodiment, where
Figure 1B:
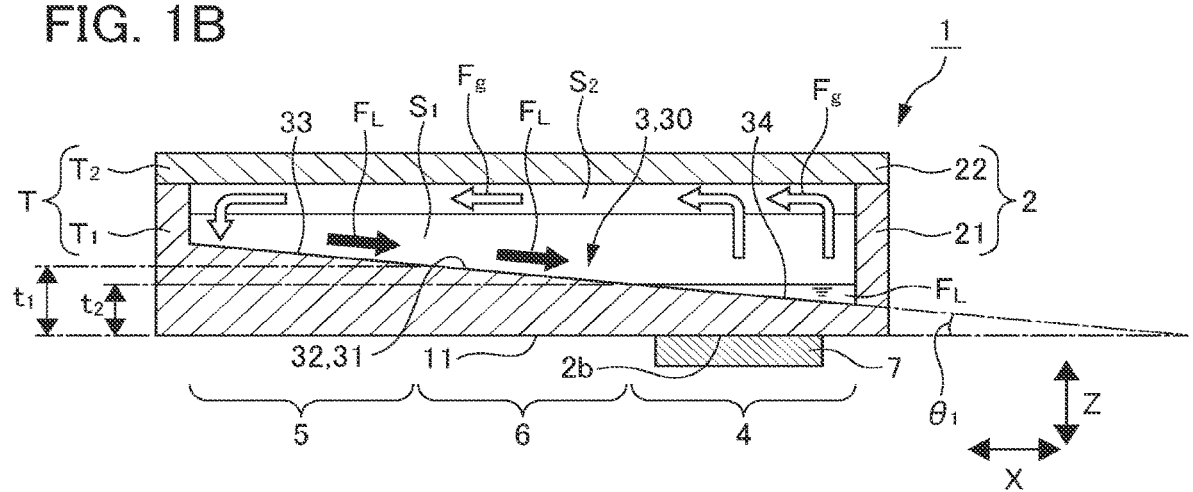
Figure 1C:
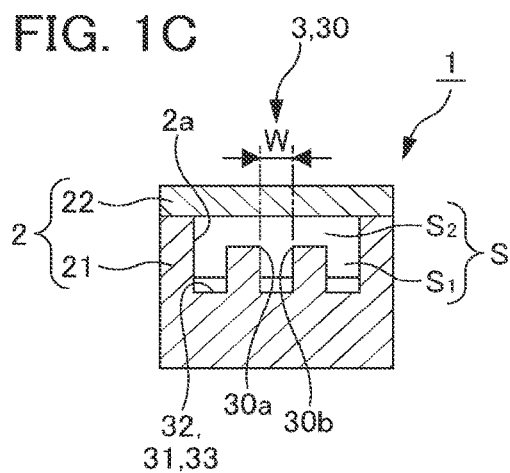
Figure 1D:
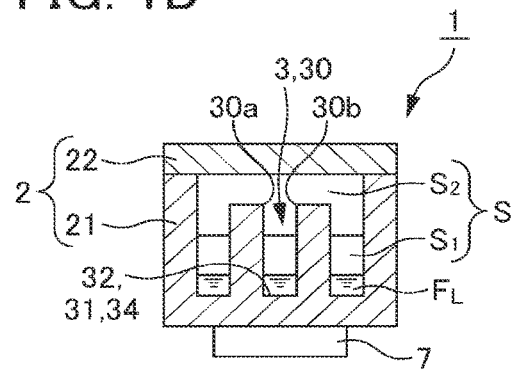

FIGS. 1A to 1D are views showing the internal structure of a vapor chamber which is a heat transport device of a first embodiment, where FIG. 1A is a plan perspective view, FIG. 1B is a cross-sectional view when cutting along the line $I_A$-$I_A$ in FIG. 1A, FIG. 1C is a cross-sectional view when cutting along the line $I_B$-$I_B$ in FIG. 1A, and FIG. 1D is a cross-sectional view when cutting along the line $I_C$-$I_C$ in FIG. 1A.

A heat transport device 1 of the present invention, in a container 2 having an internal space S in which the working fluid F is filled, includes an evaporator 4 which causes working fluid F to evaporate and a condenser 5 which is arranged at a position distanced from the evaporator 4 and causes the working fluid F to condense, and an intermediate part 6 which is arranged between the evaporator 4 and condenser 5, as shown in FIGS. 1A to 1D. Herein, at least one main groove 3 extending continuously from the condenser 5 through the intermediate part 6 to the evaporator 4 is formed in the container 2, at least part or the entirety of the main groove among the at least one main groove 3 is a sloped groove 30 having a sloped groove bottom 32 which, when viewing in a cross section along the extending direction X of the main groove 3, slopes from a groove bottom position 33 of the groove portion positioned at the condenser 5 towards the groove bottom position 34 of the groove portion positioned at the evaporator 4 so as to approach a bottom surface 11 of the heat transport device 1. It should be noted that, in the embodiment shown in FIGS. 1A to 1D, a case in which the entirety of the main groove 3 is the sloped groove 30 is shown.

The depth of the sloped groove 30 thereby becomes shallow at the groove portion positioned at the condenser 5, and becomes deeper at the groove portion positioned from the intermediate part 6 to the evaporator 4, as shown in FIGS. 1A to 1D. In particular, by the groove depth at the evaporator 4 becoming deeper in the sloped groove 30, it is a position where the plate thickness of the container main body 21 immediately below the groove bottom position 34 of the groove portion positioned at the evaporator 4 becomes thinner, and the distance between this groove bottom position 34 and a mounting surface of a heat generating body 7 is near. For this reason, by the working fluid F easily accepting heat from the heat generating body 7 at the groove bottom position 34, it is possible to smooth the phase change from liquid to gas of the working fluid F, and transport more of the heat to the condenser 5. As a result thereof, it is possible to raise the heat transport performance of the heat transport device 1.

Additionally, in the heat transport device 1 of the present invention, by the groove bottom 31 in the sloped groove 30 having a sloped groove bottom 32 which slopes from the groove bottom position 33 of the groove portion positioned at the condenser 5 towards the groove bottom position 34 of the groove portion positioned at the evaporator 4 so as to approach the bottom surface 11 of the heat transport device 1, the liquid-phase working fluid $F_L$ condensed by the condenser 5 tends to flow towards the evaporator 4. As a result thereof, since it is possible to make it difficult to cause stagnation of liquid in the condenser 5 and intermediate part 6, it is also possible to decrease the thermal resistance of the heat transport device 1.

It should be noted that the working fluid F exists by phase changing between the liquid state and gas state in the heat transport device 1. For this reason, a reference symbol distinguishing between the liquid-phase working fluid as $F_L$ and the gas-phase working fluid as $F_g$ may be attached for convenience of explanation hereinafter.

(Heat Transport Device)

The heat transport device 1 can have a configuration which can transport heat through the working fluid F filled in the internal space S of the container 2, and for example, can be used in various heat transfer devices such as a vapor chamber or a heat pipe. In particular, the heat transport device 1 according to the present embodiment is used as a vapor chamber as shown in FIGS. 1A to 1D.

(Container)

The container 2 used in the heat transport device 1 has the internal space S in which the working fluid F is filled. In particular, with the present embodiment, the container 2 is used as a vapor chamber formed by a plurality of metal sheets. As one example thereof, in FIGS. 1A to 1D, the container 2 having the internal space S is formed by two metal sheets sealed at ends T.

Herein, the two metal sheets respectively configure a container main body 21 and a lid 22, in which the upper surface of the container main body 21 and lower surface of the lid 22 are formed so as to be sealed by the ends T of the container 2. The container main body 21 and lid 22 may have the same structure. In the case of these having the same structure, the one at the lower side among the container main body 21 and lid 22 is the container main body 21, and the one at the upper side is the lid 22.

The internal space S of the container 2 in which the heat transport device 1 is provided is a space sealed relative to the external environment, and is reduced pressure by a degassing process. It is thereby configured so as to prevent leakage of liquid-phase working fluid $F_L$ and gas-phase working fluid $F_g$ from the container 2, as well as adjust the pressure of the internal pressure S, and operate at the desired operating temperature.

It is not necessary for the planar shape of the container 2 to be particularly limited, and various shapes such as circular, triagonal and polygonal can be exemplified in addition to the rectangular shape shown in FIGS. 1A to 1D, and it is particularly preferable to make a shape corresponding to the shape of the portion where the vapor chamber is mounted. The thickness of the container 2 is not particularly limited; however, for example, it is preferably in the range of at least 0.1 mm and no more than 2.0 mm.

The material constituting the container 2 is not particularly limited, and for example, heat conductive materials can be exemplified. In particular, from the viewpoint of obtaining high heat conductivity, the container 2 is preferably configured from metal or alloy, and as an example thereof, it is possible to exemplify copper, copper alloy, aluminum, aluminum alloy, nickel, nickel alloy, steel alloy (e.g., stainless steel), titanium, titanium alloy, etc. Thereamong, from the viewpoint of obtaining particularly high heat conductivity, the container 2 is preferably configured from copper or copper alloy.

The working fluid F filled in the container 2 is not particularly limited, and extensive materials can be used; for example, it is possible to exemplify an electrically insulating refrigerant. As specific examples, for example, it is possible to exemplify water, fluorocarbons, cyclopentane, ethylene glycol, mixtures of these, etc. Among these working fluids F, from the point of electrical insulating property, fluorocarbons, cyclopentane and ethylene glycol are preferable, and fluorocarbons are particularly preferable.

In the container 2 are provided the evaporator 4 which causes the working fluid F to evaporate, the condenser 5 arranged at a position distanced from the evaporator 4 and causing the working fluid F to condense, and the intermediate part 6 arranged between the evaporator 4 and condenser 5. More specifically, provided are the evaporator 4 which causes the liquid-phase working fluid $F_L$ to evaporate and phase change to the gas-phase working fluid $F_g$; the condenser 5 which is arranged at a position distanced form the evaporator 4 and causes the gas-phase working fluid $F_g$ to condense and phase change to the liquid-phase working fluid $F_L$; and the intermediate part 6 which is arranged between the evaporator 4 and condenser 5, and in which fluid flows in opposite directions to each other are formed by the gas-phase working fluid $F_g$ and the liquid-phase working fluid $F_L$.

Thereamong, the evaporator 4 is formed in the container 2 at a position corresponding to the mounting position of the heat generating body 7, and is formed at an end-side portion of the container 2 in the heat transport device 1 of FIGS. 1A to 1D, for example. The evaporator 4 has a function of receiving heat (absorbing heat) from the heat generating body 7 thermally connected. More specifically, as illustrated in FIG. 1B, by heating and evaporating the liquid-phase working fluid $F_L$ by transferring heat from the heat generating body 7 to the liquid-phase working fluid $F_L$ filled in the internal space S of the container 2, and phase changing to the gas-phase working fluid $F_g$, the heat received from the heat generating body 7 is absorbed as latent heat of vaporization.

In addition, the condenser 5 is arranged at a position distanced from the evaporator 4, and is arranged at the other end side portion of the container 2 in the heat transport device 1 of FIGS. 1A to 1D, for example. This condenser 5 has a function of radiating the heat of the gas-phase working fluid $F_g$ which phase changed in the evaporator 4 and was transported. More specifically, the condenser 5 causes the gas-phase working fluid $F_g$ to condense and phase change to the liquid-phase working fluid $F_L$ as illustrated in FIG. 1B, and thereby releases the heat of the working fluid $F_g$ transported as latent heat of condensation to outside of the container 2. Otherwise, the liquid-phase working fluid $F_L$ produced in the condenser 5 flows along the sloped groove 30 described later, and returns to the evaporator 4 through the intermediate part 6. The liquid-phase working fluid $F_L$ having returned to the evaporator 4 is used again for absorbing the heat from the heat generating body 7.

In addition, the intermediate part 6 is arranged between the evaporator 4 and condenser 5, and is configured so that the gas-phase working fluid $F_g$ heading from the evaporator 4 to the condenser 5 and the liquid-phase working fluid $F_L$ heading from the condenser 5 to the evaporator 4 form fluid flows in opposite directions to one another. In the intermediate part 6, the liquid-phase working fluid Ft is supplied to the evaporator 4 along the sloped groove 30, and the gas-phase working fluid $F_g$ is supplied to the condenser 5 through the main groove 3 and/or gap above this.

(Main Groove)

The heat transport device 1 of the present invention includes at least one main groove 3 extending continuously from the condenser 5 through the intermediate part 6 to the evaporator 4, in the inner circumferential surface 2a of the container 2. Herein, the main groove 3 is provided at least to the container main body 21, among the aforementioned two metal sheets.

In the main groove 3, a part or the entirety of the main groove is a sloped groove 30 having a sloped groove bottom 32 which, when viewing in a cross section along the extending direction X and depth direction Z of the main groove 3 such as that illustrated in FIG. 1B, slopes from a groove bottom position 33 of the groove portion positioned at the condenser 5 towards the groove bottom position 34 of the groove portion positioned at the evaporator 4 so as to approach a bottom surface 11 of the heat transport device 1. By the groove portion of the groove bottom 31 positioned at the evaporator 4 becoming deep (groove bottom position 33 being position near in the depth direction Z of the main groove 3), since the groove bottom position 34 of the groove portion positioned at the evaporator 4 is a position close to the heat generating body 7 at the lower side of the evaporator 4, it is thereby possible to smooth the phase change from the liquid phase to gas phase of the working fluid F at the groove bottom position 34, and accept more of the heat from the heat generating body 7. As a result thereof, the heat transport performance of the heat transport device 1 can improve. Additionally, by the liquid-phase working fluid $F_L$ condensed at the condenser 5 easily flowing toward the evaporator 4, since stagnation of liquid in the condenser 5 or intermediate part 6 hardly occurs, it is possible to also reduce the thermal resistance of the heat transport device 1.

At the sloped groove 30 in the main groove 3, as shown in FIG. 1B, the plate thickness of the container 2 positioned directly below the sloped groove bottom 32 is preferably formed so as to be thinner from the groove portion positioned at the condenser 5 towards the groove portion positioned at the evaporator 4. More specifically, the sloped groove 30 is preferably formed in a thickness such that the maximum value $t_2$ of the plate thickness of the container 2 positioned directly below the groove bottom position 34 of the groove portion positioned at the evaporator 4 is smaller than the maximum value $t_1$ of the plate thickness of the container 2 positioned directly below the groove bottom position 33 of the groove portion positioned at the condenser 5. By the maximum value $t_2$ of the plate thickness of the container 2 at the groove bottom position 34 positioned at the evaporator 4 becoming smaller, the liquid-phase working fluid $F_L$ at the evaporator 4 tends to be heated by the heat generating body 7, and by the intermediate part 6 or condenser 5 of the container 2 becoming relatively thicker, the heat of the heat generating body 7 hardly transfers directly; therefore, it is possible to make the phase change from liquid phase to gas phase of the working fluid F in the groove bottom position 34 smoother.

The sloped groove bottom 32 preferably slopes relative to a heat input surface 2b of the container 2 to which the heat generating body 7 is thermally connected. Herein, the magnitude of sloping of the sloped groove bottom 32 is not particularly limited; however, from the viewpoint of easily flowing the liquid-phase working fluid $F_L$ toward the evaporator 4, the average slope angle θ of the groove bottom 31 relative to the heat input surface 2b of the container 2 is preferably in the range of at least 1° and no more than 30°, and more preferably in the range of at least 5° and no more than 30°.

In particular, with the present embodiment, the sloped groove bottom 32 of the sloped groove 30 is formed over the entire length of the sloped groove 30, as shown in FIG. 1B. Since the liquid-phase working fluid $F_L$ condensed by the condenser 5 tends to more easily flow toward the evaporator 4, it is thereby possible to further reduce the thermal resistance of the heat transport device 1.

The magnitude of the opening groove width w at the sloped groove 30 is preferably in the range of 1 μm and no more than 1000 μm, and is more preferably in the range of 50 μm and no more than 500 μm. Inside of the sloped groove 30, the flow of the liquid-phase working fluid $F_L$ is formed from the condenser 5 through the intermediate part 6 reaching the evaporator 4; therefore, it is thereby possible to supply the liquid-phase working fluid $F_L$ condensed by the condenser 5 to the evaporator 4 smoothly. Herein, the opening groove width w of the sloped groove 30 can be defined as the opening groove width when measured at the opening ends 30a, 30b of the sloped groove 30.

In particular, from the viewpoint of forming the flow of liquid-phase working fluid $F_L$ from the condenser 5 to the evaporator 4 by capillarity action, the magnitude of the opening groove width w at the sloped groove 30 is preferably in the range of 1 μm and no more than 300 μm, and is more preferably in the range of 50 μm and no more than 200 μm.

In addition, from the viewpoint of forming the flow of liquid-phase working fluid $F_L$ from the condenser 5 to the evaporator 4 by the gravity acting on the droplet of the working fluid F, the magnitude of the opening groove width w at the sloped groove 30 is preferably in the range of 200 μm and no more than 1000 μm, and is more preferably in the range of 400 μm and no more than 1000 μm. At this time, since it tends to form the flow of liquid-phase working fluid FT, from the condenser 5 to the evaporator 4 by gravity, it is preferable to configure so that the opening groove width w of the sloped groove 30 widens from the condenser 5 toward the evaporator 4.

The groove width of the sloped groove 30 is preferable equal to the opening groove width w, in the entirety of the depth direction Z of the main groove 3, due to facilitating evaporation of liquid-phase working fluid $F_L$ at the evaporator 4, and recovery to the sloped groove 30 of the liquid-phase working fluid $F_L$ in the condenser 5.

The depth of the sloped groove 30 refers to the distance from a portion of the inner circumference surface 2a of the container 2 at which the main groove 3 is not formed to the bottom of the sloped groove 30. Herein, from the viewpoint of being able to facilitate circulating the working fluid F via the sloped groove 30, the lower limit for the depth of the sloped groove 30 is preferably at least 100 μm, and is more preferably at least 200 μm. On the other hand, the upper limit for the depth of the sloped groove 30, from the viewpoint of not increasing the space of the heat transport device 1 more than necessary, is preferably no more than 2000 μm, and is more preferably no more than 1000 μm. In particular, as in the present embodiment, when the heat transport device 1 is a thin-type device such as a vapor chamber, the upper limit for the depth of the sloped groove 30 may be no more than 400 μm.

At least one main groove 3 formed in the container 2 is preferably two or more main grooves in order to receive more heat from the heat generating body 7 and release from the condenser 5. At this time, a plurality of sloped grooves 30 is preferably provided as the main groove 3. In the present embodiment, as shown in FIG. 1A, the two or more sloped grooves 30 which are the main groove 3 are arranged in parallel at an interval from each other, in the inner circumferential surface 2*a* of the container 2. Since it is thereby possible to circulate the liquid-phase working fluid $F_L$ in a wider range along the width direction (width direction Y of main groove 3) of the heat transport device 1, by the liquid-phase working fluid $F_L$ flowing in each of the main grooves 3 arranged in parallel, it possible to reduce the uneven distribution of the liquid-phase working fluid $F_L$ in the evaporator 4 and make it hard for dry out to occur.

Herein, when equipping a plurality of sloped grooves 30 as the main groove 3, the internal space S of the container 2 is preferably formed by a groove internal space part $S_1$ divided by the two or more sloped grooves 30, and the groove external space part $S_2$ formed above the opening ends 30*a*, 30*b* of the two or more sloped grooves 30. The groove external space part $S_2$ is formed so as to span two or more sloped grooves 30, above the groove internal space part $S_1$ divided by the sloped groove 30. At this time, since the gas-phase working fluid $F_g$ produced by absorbing heat at the evaporator 4 flows through the groove external space part $S_2$ from the evaporator 4 to the condenser 5, it is possible to transport more heat from the evaporator 4 to the condenser 5.

It should be noted that the main groove 3 may have at least one main groove not corresponding to the sloped groove 30 (not illustrated). For example, when viewed in a cross section along the extending direction X and depth direction Z of the main groove 3, it may have a main groove 3 having a sloped groove bottom 32 making an upward slope from the groove bottom position 33 of the groove portion positioned at the condenser 5 toward the groove bottom position 34 of the groove portion positioned at the evaporator 4. It is thereby possible to exhibit a heat transport function as the heat transport device 1, even when switching the positional relationship of the evaporator 4 and condenser 5.

The method of producing the heat transport device 1 equipped with the main groove 3 is not particular limited, and can use laser beam machining, cutting machining, extrusion molding, etc. on the portion to become the inner circumferential surface 2*a* of at least the container main body 21 of the container 2, for example. Thereamong, from the viewpoint of being able to easily form the sloped groove bottom 32 by a change in output of the laser, it preferably has a step of forming the main groove 3 by conducting laser beam machining on the portion to become the inner circumferential surface 2*a* of the container 2.

After forming the main groove 3 in at least the container main body 21 of the container 2, the portion to become a sealed port at the end T of the container 2 is left, the end $T_1$ of the container main body 21 and end 12 of the lid 22 are made to contact and sealed, and the working fluid F is filled from the sealed port. After filling the working fluid F, the inside of the container 2 is subjected to degassing processing such as heat deairing and vacuum deairing to establish a depressurized state. Subsequently, by sealing the sealed port, the heat transport device 1 is produced.

The method of sealing is not particularly limited, and it is possible to exemplify TIG welding, resistance welding, pressure welding and soldering, for example. It should be noted that sealing performed initially (sealing other than the portion to become the sealed port) is a process performed for sealing other than the portion at which the internal air escapes upon degassing performed thereafter, and the second time sealing (sealing of the sealed port) is a process performed for sealing a portion at which the internal air escapes upon degassing.

(Operating Principle of Vapor Chamber)

In the vapor chamber which is the heat transport device 1, the liquid-phase working fluid $F_L$ is filled into the internal space S prior to operation, and is supplied to the evaporator 4.

When the temperature of the evaporator 4 rises by the heat generating body 7 generating heat, the heat of the heat generating body 7 is transferred to the container 2, and the heat is transferred to the evaporator 4 which is in the vicinity of the heat generating body 7 of the container 2. With the evaporator 4, the liquid-phase working fluid $F_L$ is heated, the temperature rises and reaches the boiling temperature, and the gas-phase working fluid $F_g$ is discharged to the internal space S, by phase changing from the liquid-phase working fluid $F_L$ to the gas-phase working fluid F. In addition, by phase change from the liquid-phase working fluid $F_L$ to gas-phase working fluid $F_g$, the heat from the heat generating body is absorbed to the gas-phase working fluid $F_g$ as vaporization heat. At this time, by the sloped groove 30 of the main groove 3 sloping from the groove bottom position 33 of the groove portion positioned at the condenser 5 toward the groove bottom position 34 of the groove portion positioned at the evaporator 4 so as to approach the bottom surface 11 of the heat transport device 1, phase change from the liquid phase to gas phase of the working fluid F is promoted, and it is possible to absorb more heat to the gas-phase working fluid $F_g$ as vaporization heat.

In the gas-phase working fluid $F_g$ having absorbed heat by the evaporator 4, by flowing to the condenser 5 on the upper side in the internal space S of the container 2, particularly through the groove external space part $S_2$ formed above the opening ends 30*a*, 30*b* of the sloped groove 30 as shown in FIG. 1A in the present embodiment, the heat received from the heat generating body 7 is transported from the evaporator 4 through the intermediate part 6 to the condenser 5.

Subsequently, the gas-phase working fluid $F_g$ transported to the condenser 5 is made to phase change to the liquid phase, by a heat exchanging means (not illustrated) with the condenser 5. At this time, the heat of the heat generating body having been transported is released to outside of the vapor chamber as latent heat of condensation. On the other hand, the liquid-phase working fluid $F_L$ having phase changed to the liquid phase by releasing heat by the condenser 5 then flowing along the main groove 3 from the condenser 5 through the intermediate part 6 to the evaporator 4, it is possible to facilitate forming circulatory flow of the working fluid F between the evaporator 4 and condenser 5.

Second Embodiment

Figure 2A:
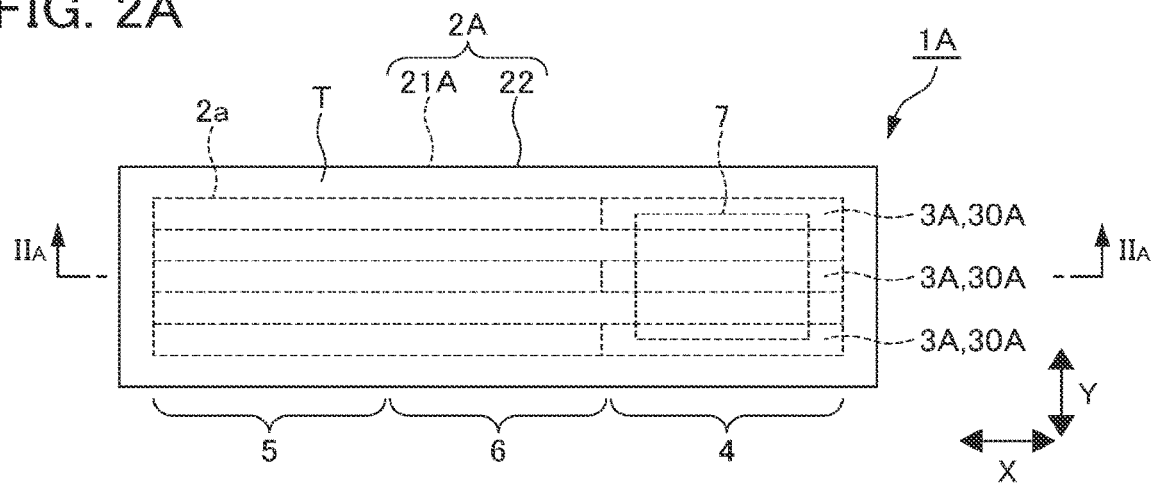
FIGS. 2A and 2B are views showing the internal structure of a vapor chamber which is a heat transport device of a second embodiment, where
Figure 2B:
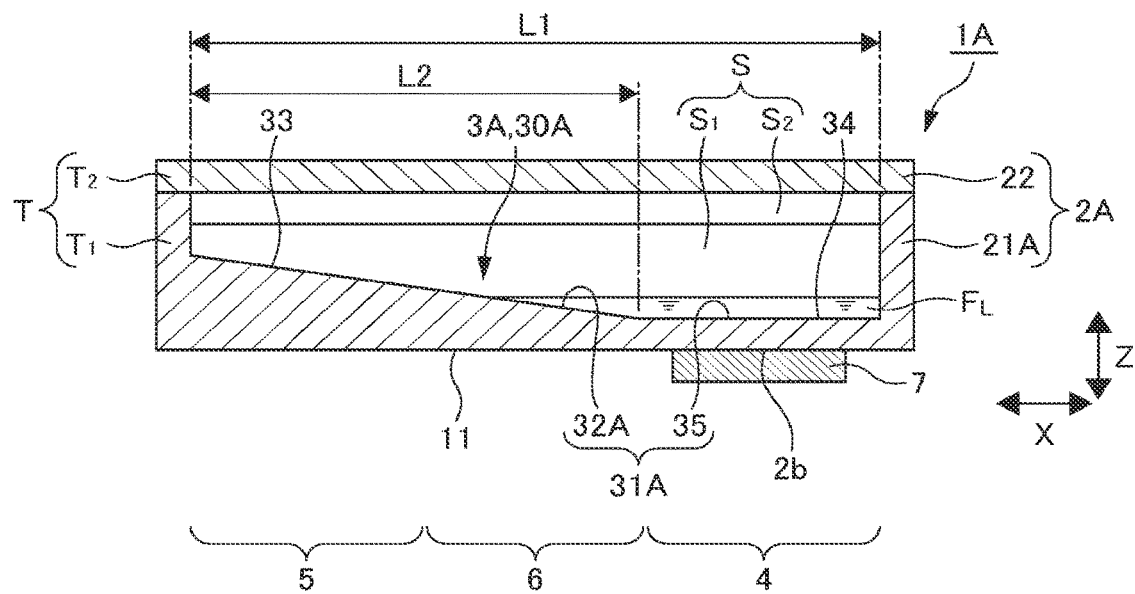

FIGS. 2A and 2B are views showing the internal structure of a vapor chamber which is a heat transport device of the second embodiment, in which FIG. 2A is a plan perspective view, and FIG. 2B is a cross-sectional view when cutting along the line $II_A$-$II_A$ of FIG. 2A. It should be noted that, in the following explanation, the same reference numbers are attached to constituent elements which are identical with the above first embodiment or second embodiment and explanations thereof are omitted or simplified, and the points of difference are mainly explained.

In the aforementioned first embodiment, as shown in FIG. 1B, a configuration is shown in which the sloped groove bottom 32 of the sloped groove 30 is formed over the entire length of the groove bottom 31 of the sloped groove 30; however, it is not limited thereto. For example, as shown in FIG. 2B, it is sufficient so long as the sloped groove bottom 32A is formed at a groove portion of the sloped groove 30A extending from at least the condenser 5 to the intermediate part 6, in the groove bottom 31A of the sloped groove 30A. On the other end, the sloped groove bottom 32A is not necessarily formed at the groove portion positioned at the evaporator 4.

With the heat transport device of the present invention, by providing the sloped groove bottom 32A so that the sloped groove bottom 32A extends from at least the condenser 5 to the intermediate part 6 in this way, the supply of the liquid-phase working fluid $F_L$ from the condenser 5 to the evaporator 4 is promoted.

At this time, at least part of the groove portion positioned at the evaporator 4 in the groove bottom 31A of the sloped groove 30A preferably includes a parallel groove bottom 35 relative to the heat input surface 2b of the container 2A. Since the deviation in heat transmitted to the parallel groove bottom 35 from the heat input surface 2b is reduced by the evaporator 4, it is possible to further promote the phase change from the liquid phase to gas phase of the working fluid F in the evaporator 4.

<Third Evaporator>

Figure 3A:
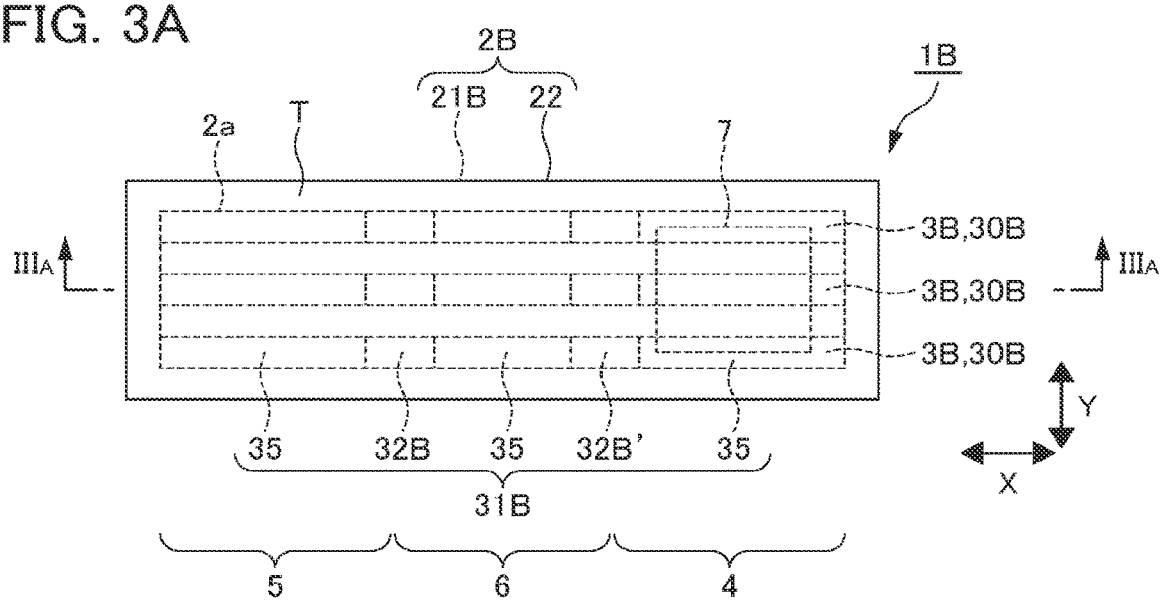
FIGS. 3A and 3B are views showing the internal structure of a vapor chamber which is a heat transport device of a third embodiment, where
Figure 3B:
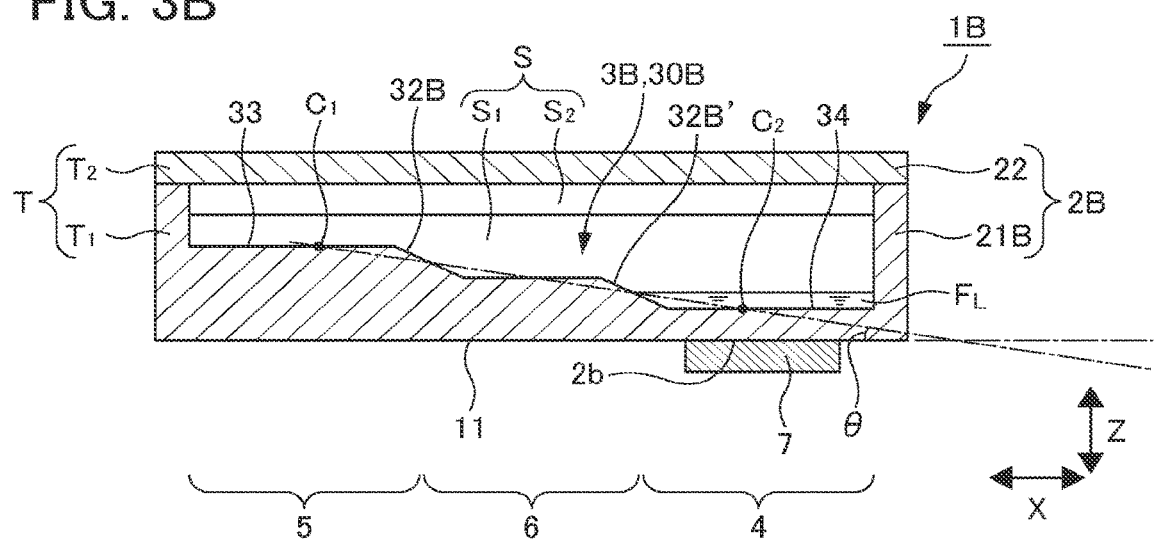

FIGS. 3A and 3B are views showing an internal structure of the vapor chamber which is the heat transport device of a third embodiment, in which FIG. 3A is a plan perspective view, and FIG. 3B is a cross-sectional view when cutting along the line $III_A$-$III_A$ in FIG. 3A. It should be noted that, in the following explanation, the same reference numbers are attached to constituent elements which are identical with the above first to second embodiments and explanations thereof are omitted or simplified, and the points of difference are mainly explained.

In the aforementioned first embodiment, as shown in FIG. 1B, a configuration is shown in which the sloped groove bottom 32 of the sloped groove 30 is formed continuously over the entire length of the groove bottom 31 of the sloped groove 30; however, it is not limited thereto. For example, as shown in FIG. 3B, sloped groove bottoms 32B, 32B' may be discontinuously formed in the groove bottom 31B of the sloped groove 30B. At this time, the section of the sloped groove 30B sandwiched by the sloped groove bottoms 32B, 32B' is preferably configured by the parallel groove bottom 35. In this way, by discontinuously forming the sloped groove bottoms 32B, 32B' in the groove bottom 31B, it is possible to achieve thinning of the container 2B equipped with the sloped groove 30B.

Herein, when viewing in a cross section along the extending direction X and depth direction Z of the main groove 3, the average slope θ relative to the heat input surface 2b of the groove bottom 31B, i.e. average slope θ which is the slope of the line connecting the center position $C_1$ of the condenser 5 and center position $C_2$ of the evaporator 4, is preferably an angle in the range of at least 1° and no more than 30° relative to the heat input surface 2b of the container 2B. It is thereby possible to further reduce the thermal resistance of the heat transport device 1, due to facilitating the liquid-phase working fluid $F_L$ flowing from the condenser 5 toward the evaporator 4.

Fourth Embodiment

Figure 4A:
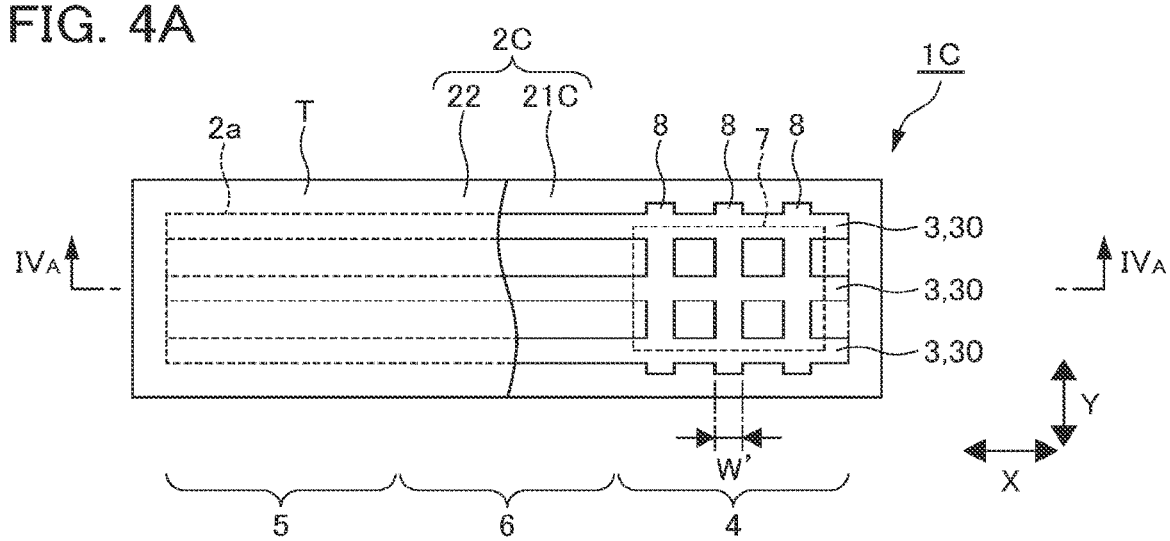
FIGS. 4A and 4B are views showing the internal structure of a vapor chamber which is a heat transport device of a fourth embodiment, where
Figure 4B:
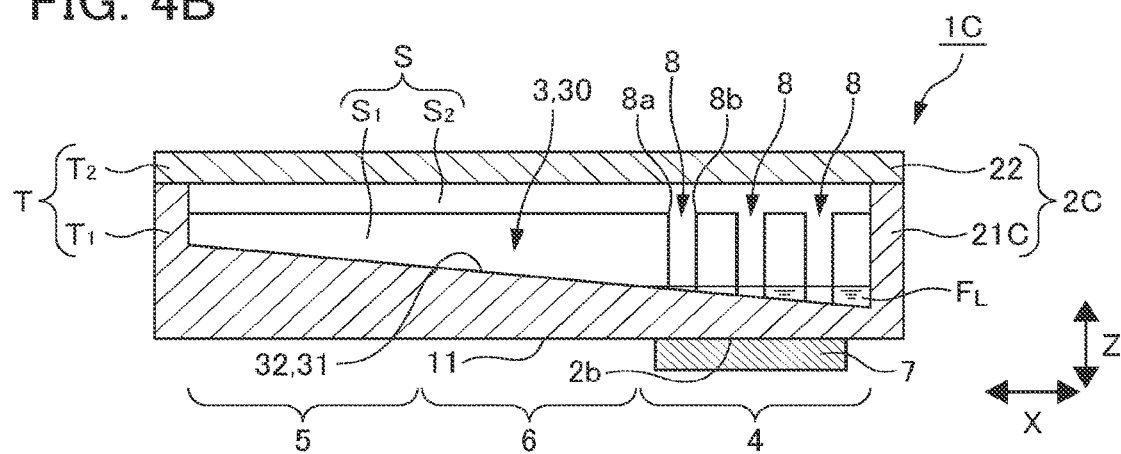

FIGS. 4A and 4B are views showing the internal structure of a vapor chamber which is a heat transport device of a fourth embodiment, where FIG. 4A is a plan perspective view, and FIG. 4B is a cross-sectional view when cutting along the line $IV_A$-$IV_A$ in FIG. 4A. FIG. 4A, for convenience of explanation, illustrates by omitting part of the lid 22 of the container 2C. It should be noted that, in the following explanation, the same reference numbers are attached to constituent elements which are identical with the above first to third embodiments and explanations thereof are omitted or simplified, and the points of difference are mainly explained.

In the aforementioned first embodiment, as shown in FIGS. 1A and 1B, a configuration is shown in which at least one main groove 3 is formed to extend continuously form the condenser 5 through the intermediate part 6 to the evaporator 4 in the container 2; however, it is not limited thereto. For example, as in the heat transport device 1 shown in FIGS. 4A and 4B, the container 2C preferably includes one or two or more auxiliary grooves 8 that extend in a direction crossing the main groove 3 in the evaporator 4. By the liquid-phase working fluid $F_L$ supplied from the condenser 5 to the evaporator 4 via the sloped groove 30, etc. spreading along the extending direction X of the main groove 3, and spreading even along the width direction Y of the main groove 3 via the auxiliary groove 8, the area of the portion at which the working fluid F evaporates in the evaporator 4 increases; therefore, it is possible to easily perform phase change from the liquid phase to gas phase of the working fluid F in the evaporator 4. In addition, even in the case of the amount of the liquid-phase working fluid $F_L$ supplied to the evaporator 4 greatly differing for every main groove 3, since the liquid-phase working fluid $F_L$ is exchanged via the auxiliary groove 8, it is possible to make dry out of the heat transport device 1 hardly occur.

The magnitude of the opening groove width w' of the auxiliary groove 8, similarly to the magnitude of the opening groove width w in the sloped groove 30, is preferably in the range of at least 1 μm and no more than 1000 μm, and more preferably in the range of at least 50 μm and no more than 500 μm. Herein, the opening groove width w' of the auxiliary groove 8 can be set as the opening groove width when measuring at the opening ends 8a, 8b of the auxiliary groove 8.

In addition, the container 2C may further include one or two grooves not included among the main groove 3 and auxiliary groove 8, in the evaporator 4. At this time, it is preferable for at least part of the inner circumferential surface 2a of the container 2 in the evaporator 4 to be missing by the groove formed in the evaporator 4. It is thereby possible to further increase the area of the portion at which the working fluid F evaporates.

Fifth Embodiment

Figure 5A:
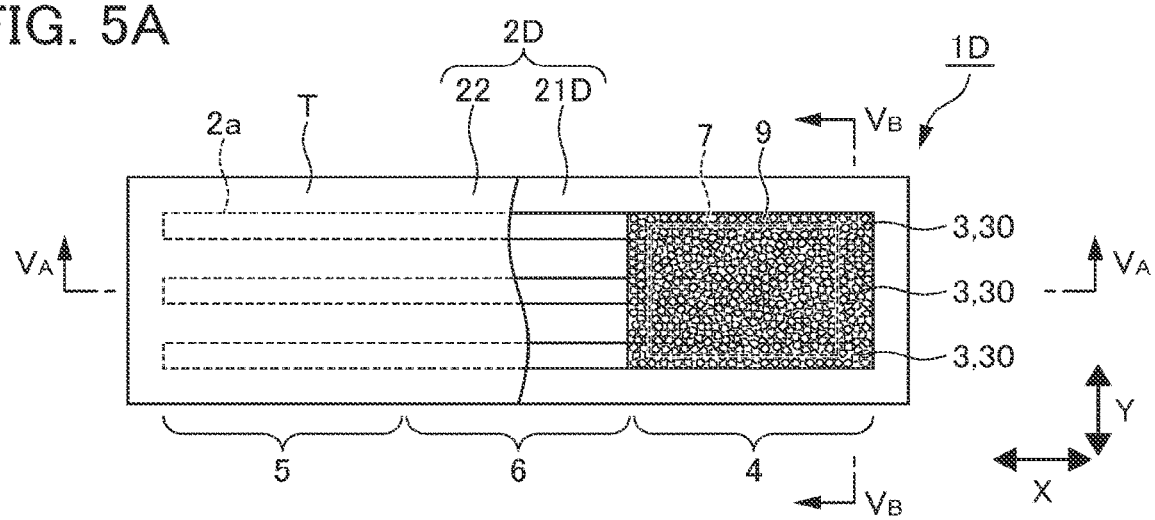
FIGS. 5A to 5C are views showing the internal structure of a vapor chamber which is a heat transport device of a fifth embodiment, where
Figure 5B:
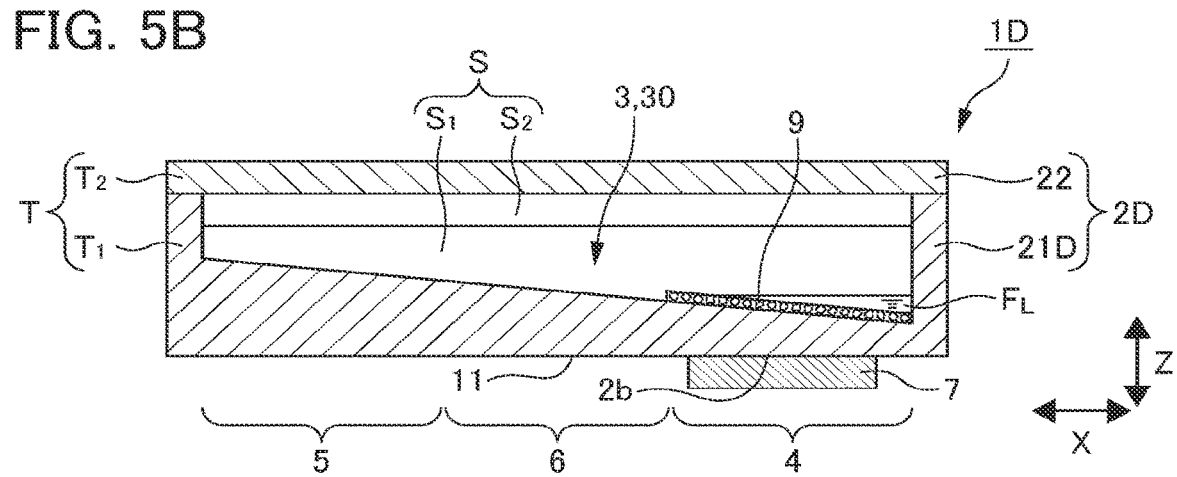
Figure 5C:
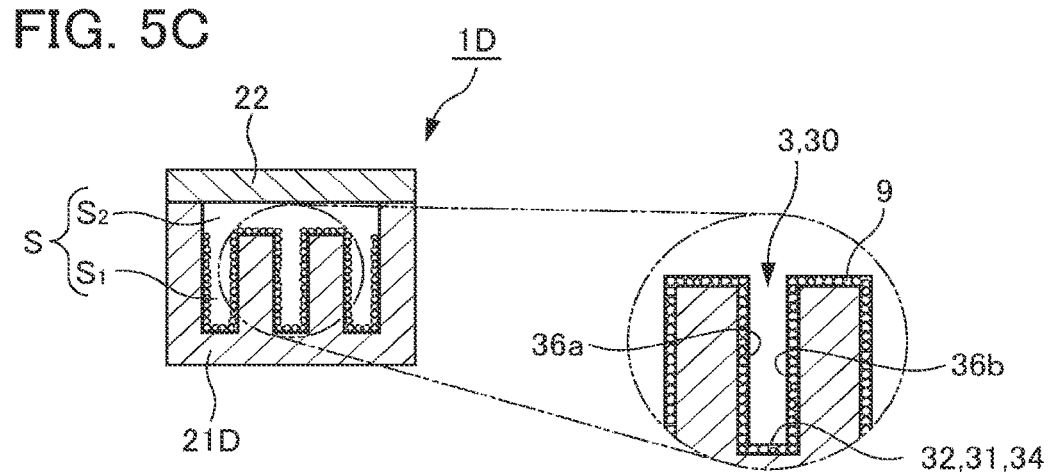

FIGS. 5A to 5C are views showing the internal structure of a vapor chamber which is a heat transport device of a fifth embodiment, where FIG. 5A is a plan perspective view, FIG. 5B is a cross-sectional view when cutting along the line $V_A$-$V_A$ in FIG. 5A, and FIG. 5C is a cross-sectional view when cutting along the line $V_B$-$V_B$ in FIG. 5A. FIG. 5A illustrates by partially omitting the lid 22 of the container 2D for convenience of explanation. It should be noted that, in the following explanation, the same reference numbers are attached to constituent elements which are identical with the above first to fourth embodiments and explanations thereof are omitted or simplified, and the points of difference are mainly explained.

In the aforementioned first embodiment, a configuration is shown which does not perform surface processing on the main groove 3 including the sloped groove 30, as shown in FIG. 1B; however, it is not limited thereto. For example, as in the heat transport device 1D shown in FIGS. 5A and 5B, the container 2 may have a porous material 9 at the inner surface portion of the evaporator 4 facing the internal space S. By configuring the inner surface portion of the evaporator 4 by the porous material 9, since the area of the portion at which the porous material 9 and liquid-phase working fluid $F_L$ contact increases, it is possible to easily conduct phase change from liquid phase to gas phase of the working fluid F in the evaporator 4.

Herein, the porous material 9 is preferably formed at the inner surface portion of the evaporator 4 facing the internal space S, and more specifically, is preferably formed in at least the groove bottom 31 of the main groove 3 of the evaporator 4. In addition, it preferably formed at both the groove bottom 31 of the main groove 3 and the groove wall surfaces 36a, 36b of the evaporator 4. By the porous material 9 being formed at the groove bottom 31 and/or groove wall surfaces 36a, 36b, which are the inner surface portion of the main groove 3 of the evaporator 4, since the area of the portion at which the inner surface portion of the main groove 3 and liquid-phase working fluid $F_L$ increases, it is possible to easily conduct phase change from liquid phase to gas phase of the working fluid F in the evaporator 4.

The porous material 9 is not particularly limited, and it is possible for exemplify a sintered compact of a powder of a heat conductive material, for example. In particular, from the viewpoint of obtaining high thermal conductivity, the porous material 9 is preferably configured from metal or alloy, and as examples thereof, it is possible to exemplify copper, copper alloy, aluminum, aluminum alloy, titanium, titanium alloy, steel and steel alloy (for example, stainless steel), etc.

In addition, the porous material 9 is preferably configured by a sintered compact which was sintered to include metal or alloy of powder, fiber, flake, porous or fragment form. The area of the portion at which the inner surface portion of the main groove 3 and liquid-phase working fluid FT, contact thereby tends to increase.

The method of forming such a porous material 9 is not particularly limited, and the sintered compact may be formed by forming a layer of material by supplying metal or alloy of powder, fiber, flake, porous or fragment form to at least the groove bottom 31 of the main groove 3 in the container 2 in which the main groove 3 is formed, and locally heating the layer of material by laser beam processing. In addition, upon forming the main groove 3 by laser processing, by generating fines at the groove interior and locally heating by laser beam processing at least the inner surface of the groove portion positioned at the evaporator 4, it is also possible to form the porous material 9 at the groove bottom 31 and/or groove wall surfaces 36a, 36b, which are the inner surface portion of the main groove 3 in the evaporator 4.

Sixth Embodiment

Figure 6A:
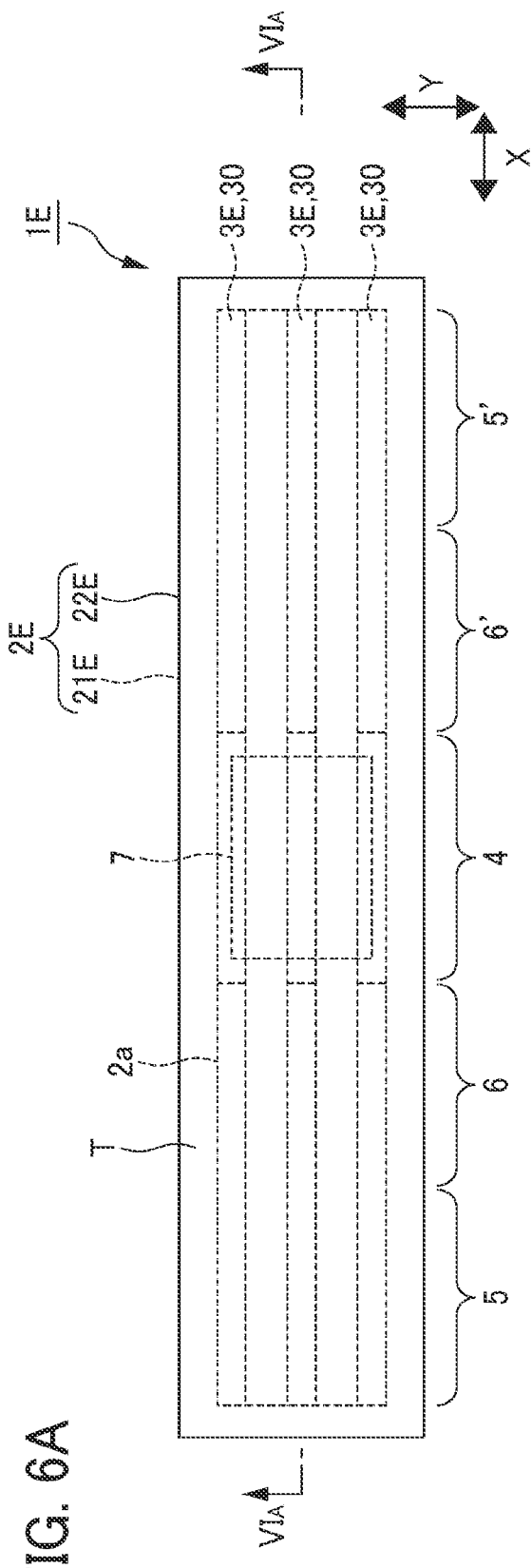
FIGS. 6A and 6B are views showing the internal structure of a vapor chamber which is a heat transport device of a sixth embodiment, where
Figure 6B:
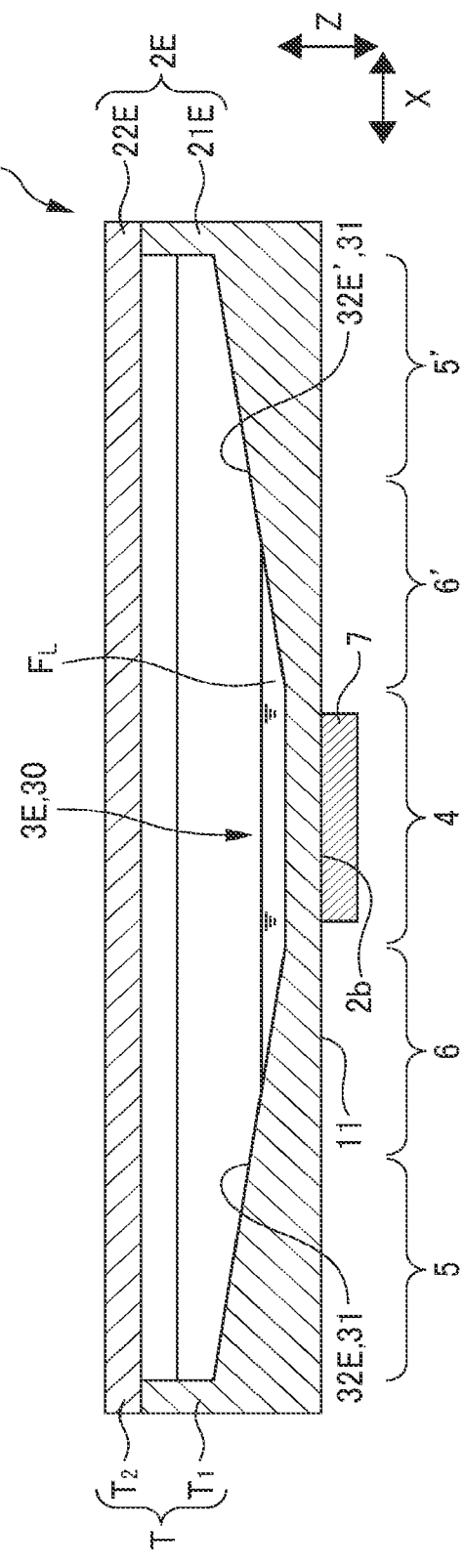

FIGS. 6A and 6B are views showing the internal structure of a vapor chamber which is a heat transport device of a sixth embodiment, where FIG. 6A is a plan perspective view, and FIG. 6B is a cross-sectional view when cutting along the line $VI_A$-$VI_A$ in FIG. 6A. It should be noted that, in the following explanation, the same reference numbers are attached to constituent elements which are identical with the above first to fifth embodiments and explanations thereof are omitted or simplified, and the points of difference are mainly explained.

In the aforementioned first embodiment, as shown in FIGS. 1A and 1B, a configuration is shown providing one of each of the evaporator 4 and condenser 5. For example, as in the heat transport device 1E shown in FIGS. 6A and 6B, one evaporator 4, a plurality of condensers 5, 5' arranged at positions distanced from the evaporator 4, and intermediate parts 6, 6' respectively arranged between the evaporator 4 and these condensers 5, 5' may be provided in the container 2E. It is thereby possible to drastically improve the heat transport performance of the heat transport device 1, due to being able to flow the gas-phase working fluid $F_g$ generated by phase change in the evaporator 4 to be dispersed to a plurality of condensers 5, 5'.

Seventh Embodiment

Figure 7A:
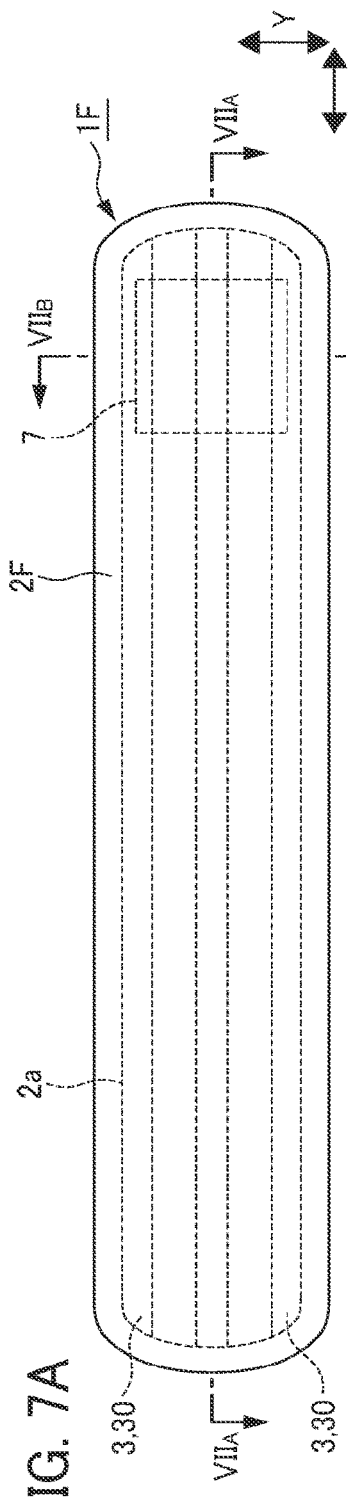
FIGS. 7A to 7C are views showing the internal structure of a vapor chamber which is a heat transport device of a seventh embodiment, where
Figure 7B:
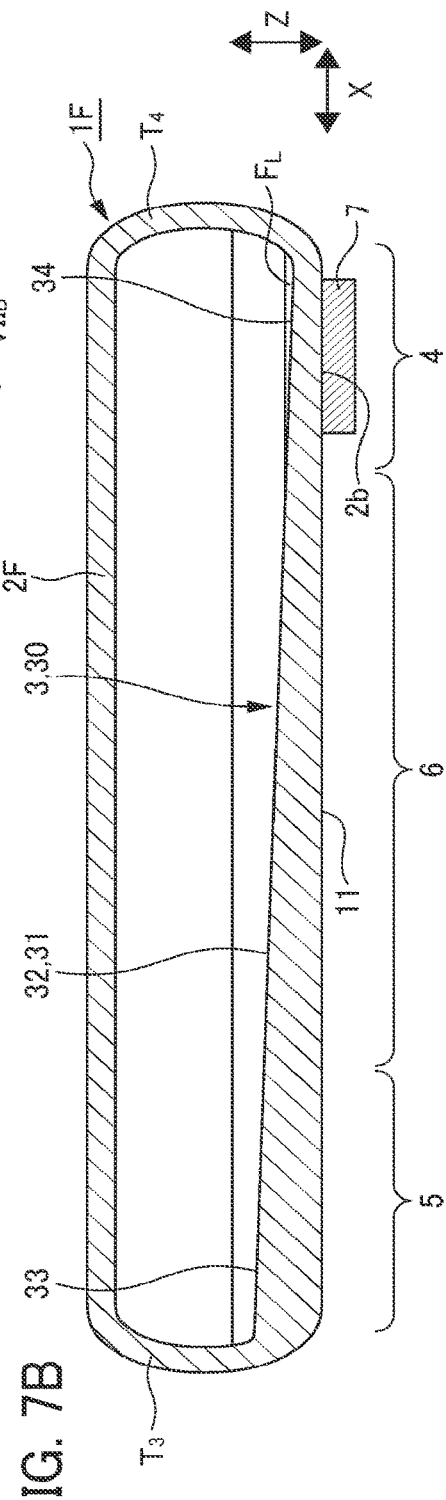
Figure 7C:
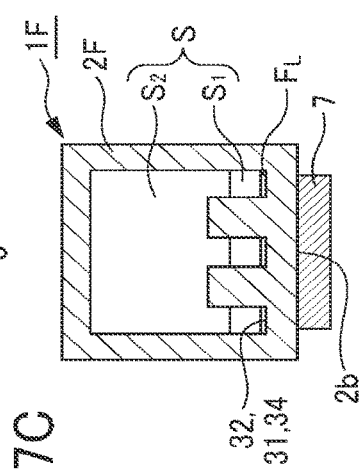

FIGS. 7A to 7C are views showing the internal structure of a vapor chamber which is a heat transport device of a seventh embodiment, where FIG. 7A is a plan perspective view, FIG. 7B is a cross-sectional view when cutting along the line $VII_A$-$VII_A$ in FIG. 7A, and FIG. 7C is a cross-sectional view when cutting along the line $VII_B$-$VII_B$ in FIG. 7A. It should be noted that, in the following explanation, the same reference numbers are attached to constituent elements which are identical with the above first to sixth embodiments and explanations thereof are omitted or simplified, and the points of difference are mainly explained.
(Container)

The heat transport device 1F of the present embodiment is formed by a tubular container with a rectangular cross-sectional shape, and can be used as a heat pipe. Herein, the container 2F to which the heat transport device 1F is provided is sealed at the ends $T_3$, $T_4$. In addition, the internal space S of the container 2F is a space sealed relative to the external environment, and is reduced pressure by a degassing process. The heat pipe which is the heat transport device 1F of the present embodiment operates by a similar operating principle as the vapor chamber; however, the container 2F is a tubular container, and thereby differs from the container of the vapor chamber in the point of having an internal space S which is relatively wide.

The extended shape for the longitudinal direction of the container 2F (extending direction X of the main groove 3 in FIG. 7A) can be exemplified as a shape having a curve, in addition to the linear shape shown in FIG. 7A, and is not particularly limited. A cross-sectional shape when cutting along the orthogonal direction to the longitudinal direction of the container 2F (width direction Y of main groove 3 in FIG. 7A) can be exemplified by a shape in which the bottom side is linear, as in a flat shape or polygonal shape, in addition to the rectangle shown in FIG. 7C. The external dimensions of the container 2F are not particularly limited; however, in the case of the cross-sectional shape of the container 2F being rectangular, for example, it is preferably in the range of at least 5 mm and no more than 20 mm.
(Operating Principle of Heat Pipe)

Next, the mechanism of heat transport of the heat pipe which is the heat transport device 1 will be explained below using the heat pipe shown in FIGS. 7A to 7C.

First, the liquid-phase working fluid $F_L$ is supplied to the evaporator 4 along the main groove 3 which extends in the longitudinal direction towards the inner circumferential surface 2a of the container 2.

When the temperature of the evaporator 4 rises by the heat generating body 7 generating heat, the heat of the heat generating body 7 is transferred to the container 2, and the heat is transferred to the evaporator 4 which is in the vicinity of the heat generating body 7 of the container 2F. With the evaporator 4, the liquid-phase working fluid $F_L$ is heated, the temperature rises to boiling, and the gas-phase working fluid $F_g$ is discharged to the internal space S, by phase changing from the liquid-phase working fluid $F_L$ to the gas-phase working fluid $F_g$. In addition, by phase change from the liquid-phase working fluid $F_L$ to gas-phase working fluid $F_g$, the heat from the heat generating body is absorbed to the gas-phase working fluid $F_g$ as vaporization heat. At this time, by the sloped groove 30 of the main groove 3 sloping from the groove bottom position 33 of the groove portion positioned at the condenser 5 toward the groove bottom position 34 of the groove portion positioned at the evaporator 4 so as to approach the bottom surface 11 of the heat transport device 1, phase change from the liquid phase to gas phase of the working fluid F is promoted, and it is possible to absorb more heat to the gas-phase working fluid $F_g$ as vaporization heat.

In the gas-phase working fluid $F_g$ having absorbed heat by the evaporator 4, by flowing to the condenser 5 on the upper side in the internal space S of the container 2, the heat received from the heat generating body 7 is transported from the evaporator 4 through the intermediate part 6 to the condenser 5.

Subsequently, the gas-phase working fluid $F_g$ transported to the condenser 5 is made to phase change to the liquid phase, with the condenser 5. At this time, the heat of the heat generating body having been transported is released to outside of the heat pipe as latent heat of condensation. On the other hand, the liquid-phase working fluid $F_L$ having phase changed to the liquid phase by releasing heat at the condenser 5 flowing along the main groove 3 from the condenser 4 through the intermediate part 6 to the evaporator 5, it is possible to form circulatory flow of the working fluid F between the evaporator 4 and condenser 5.

Although embodiments of the present invention have been explained above, the present invention encompasses all aspects included in the gist of the present invention and the claims without being limited to the above-mentioned embodiment, and can be modified in various ways within the scope of the present invention.

EXPLANATION OF REFERENCE NUMERALS 1, 1A to 1F heat transport device
11 bottom surface of heat transport device
2, 2A to 2F container
2a inner circumferential surface of container
2b heat input surface of container
21, 21A to 21E container main body
22, 22E lid
3, 3A, 3B main groove
30, 30A, 30B sloped groove
30a, 30b opening end of sloped groove
31, 31A, 31B groove bottom
32, 32A, 32B, 32B' sloped groove bottom
33 groove bottom position of groove portion positioned at condenser
34 groove bottom position of groove portion positioned at evaporator
35 parallel groove bottom
36a, 36b groove wall surface
4 evaporator
5 condenser
6 intermediate part
7 heat generating body
8 auxiliary groove
8a, 8b opening end of auxiliary groove
9 porous material
$C_1$ center position of condenser
$C_2$ center position of evaporator
F working fluid
$F_L$ liquid-phase working fluid
$F_g$ gas-phase working fluid
S intermediate space
$S_1$ groove internal space part
$S_2$ groove external space part
X extending direction of main groove
Y width direction of main groove
Z depth direction of main groove
T end of container
$T_1$ end of container main body
$T_2$ end of lid
$T_3$, $T_4$ end of tubular container
$t_1$ minimum value of plate thickness of container positioned directly below groove bottom position of condenser
$t_2$ maximum value of plate thickness of container positioned directly below groove bottom position of condenser
w opening groove width of sloped groove
w' opening groove width of auxiliary groove
θ average slope angle of groove bottom relative to heat input surface of container

The invention claimed is:

1. A heat transport device having a container with an internal space in which a working fluid is filled, comprising:
an evaporator;
a condenser which is arranged at a position separated from the evaporator; and
an intermediate part arranged between the evaporator and the condenser,
wherein the evaporator causes the working fluid to evaporate,
wherein the condenser causes the working fluid to condense,
wherein at least one main groove which extends continuously from the condenser to the evaporator through the intermediate part is formed in the container,
wherein a part or entirety of main grooves among the at least one main groove is a sloped groove having a sloped groove bottom that, when viewing a cross section along an extending direction of the main groove, slopes from a groove bottom position of a groove portion positioned at the condenser towards a groove bottom position of the groove portion positioned at the evaporator, so as to approach a bottom surface of the heat transport device, and
wherein a portion linking a center position of the condenser and a center position of the evaporator when viewing a cross section along the extending direction of the sloped groove, has an average sloping angle relative to a heat input surface of the container in a range of at least 1 degree and no more than 30 degrees.

2. The heat transport device according to claim 1, wherein the sloped groove is formed so that a plate thickness of the container positioned directly below the sloped groove bottom becomes thinner from the groove portion positioned at the condenser toward the groove portion positioned at the evaporator.

3. The heat transport device according to claim 1, wherein the sloped groove bottom of the sloped groove is formed at the groove portion position at the condenser and extends at least to the groove portion positioned at the intermediate part.

4. The heat transport device according to claim 1, wherein the sloped groove bottom is formed over an entire length of the sloped groove.

5. The heat transport device according to claim 1, wherein an opening groove width of the sloped groove is in a range of at least 1 μm and no more than 1,000 μm.

6. The heat transport device according to claim 1, wherein the at least one main groove formed in the container is two or more of the sloped grooves,
wherein the sloped grooves are arranged in parallel with an interval from each other, and
wherein the internal space is formed by a groove internal space parts divided by the sloped groove, and a groove external space part formed above an opening end of the sloped groove.

7. The heat transport device according to claim 6, wherein the container further includes at least one auxiliary groove extending in a direction crossing the main groove, at the evaporator.

8. The heat transport device according to claim 1, wherein the container further includes a porous material at an inner surface portion of the evaporator facing the internal space, and
wherein the porous material is configured by a sintered compact which is sintered to include metal or alloy of powder, fiber, flake, porous or fragment form.

9. The heat transport device according to claim 1, wherein the container comprises copper, copper alloy, aluminum, aluminum alloy, nickel, nickel alloy, steel alloy, titanium or titanium alloy.

10. The heat transport device according to claim 1, wherein the container is formed from a plurality of metal sheets, and is used as a vapor chamber.

11. The heat transport device according to claim 1, wherein the container is used as a heat pipe formed by a tubular container having a rectangular cross-sectional shape.

12. The heat transport device according to claim 2, wherein the sloped groove bottom of the sloped groove is formed at the groove portion positioned at the condenser and extends at least to the groove portion positioned at the intermediate part.

13. The heat transport device according to claim 2, wherein the sloped groove bottom is formed over an entire length of the sloped groove.

14. The heat transport device according to claim 2, wherein an opening groove width of the sloped groove is in a range of at least 1 μm and no more than 1,000 μm.

15. The heat transport device according to claim 2, wherein the at least one main groove formed in the container is two or more of the sloped grooves,
wherein the sloped grooves are arranged in parallel with an interval from each other, and
wherein the internal space is formed by a groove internal space parts divided by the sloped groove, and a groove external space part formed above an opening end of the sloped groove.

16. The heat transport device according to claim 2, wherein the container further includes a porous material at an inner surface portion of the evaporator facing the internal space, and
wherein the porous material is configured by a sintered compact which is sintered to include metal or alloy of powder, fiber, flake, porous or fragment form.

17. The heat transport device according to claim 2, wherein the container comprises copper, copper alloy, aluminum, aluminum alloy, nickel, nickel alloy, steel alloy, titanium or titanium alloy.

18. The heat transport device according to claim 2, wherein the container is formed from a plurality of metal sheets, and is used as a vapor chamber.

19. A heat transport device having a container in which a working fluid is filled in an internal space, comprising:
an evaporator which causes the working fluid to evaporate;
a condenser which is arranged at a position separated from the evaporator and causes the working fluid to condense; and
an intermediate part arranged between the evaporator and the condenser,
wherein the evaporator causes the working fluid to evaporate,
wherein the condenser causes the working fluid to condense,
wherein at least one main groove which extends continuously from the condenser to the evaporator through the intermediate part is formed in the container,
wherein a part or entirety of main grooves among the at least one main groove is a sloped groove having a sloped groove bottom that, when viewing a cross section along an extending direction of the main groove, slopes from a groove bottom position of a groove portion positioned at the condenser towards a groove bottom position of the groove portion positioned at the evaporator, so as to approach a bottom surface of the heat transport device,
wherein the at least one main groove formed in the container is two or more of the sloped grooves,
wherein the sloped grooves are arranged in parallel with an interval from each other, and
wherein the internal space is formed by a groove internal space parts divided by the sloped groove, and a groove external space part formed above an opening end of the sloped groove.

20. A heat transport device having a container in which a working fluid is filled in an internal space, comprising:
an evaporator which causes the working fluid to evaporate;
a condenser which is arranged at a position separated from the evaporator and causes the working fluid to condense; and
an intermediate part arranged between the evaporator and the condenser,
wherein the evaporator causes the working fluid to evaporate,
wherein the condenser causes the working fluid to condense,
wherein at least one main groove which extends continuously from the condenser to the evaporator through the intermediate part is formed in the container,
wherein a part or entirety of main grooves among the at least one main groove is a sloped groove having a sloped groove bottom that, when viewing a cross section along an extending direction of the main groove, slopes from a groove bottom position of a groove portion positioned at the condenser towards a groove bottom position of the groove portion positioned at the evaporator, so as to approach a bottom surface of the heat transport device, and wherein the container further includes at least one auxiliary groove extending in a direction crossing the main groove, at the evaporator.

* * * * *